(12) United States Patent
Gu et al.

(10) Patent No.: US 12,027,512 B2
(45) Date of Patent: Jul. 2, 2024

(54) CHIPSET AND MANUFACTURING METHOD THEREOF

(71) Applicant: Shanghai Biren Technology Co., Ltd, Shanghai (CN)

(72) Inventors: Shiqun Gu, Shanghai (CN); Linglan Zhang, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 105 days.

(21) Appl. No.: 17/468,687

(22) Filed: Sep. 8, 2021

(65) Prior Publication Data

US 2022/0399321 A1    Dec. 15, 2022

(30) Foreign Application Priority Data

Jun. 15, 2021   (CN) .......................... 202110662127.X

(51) Int. Cl.
*H01L 25/18*     (2023.01)
*H01L 23/00*     (2006.01)
(Continued)

(52) U.S. Cl.
CPC ............ *H01L 25/18* (2013.01); *H01L 23/481* (2013.01); *H01L 23/49816* (2013.01); *H01L 24/08* (2013.01); *H01L 24/80* (2013.01); *H01L 2224/08145* (2013.01); *H01L 2224/80895* (2013.01); *H01L 2224/80896* (2013.01)

(58) Field of Classification Search
CPC ........... H01L 21/56; H01L 2224/08145; H01L 2224/80895; H01L 2224/80896; H01L 2225/06524; H01L 2225/06541; H01L 23/28; H01L 23/481; H01L 23/49816; H01L 24/08; H01L 24/80; H01L 25/18; H01L 25/50

See application file for complete search history.

(56) References Cited

U.S. PATENT DOCUMENTS 10,580,757 B2 *   3/2020   Nequist .................. H01L 25/50
10,672,663 B2 *   6/2020   DeLaCruz .......... H01L 23/5286
(Continued)

FOREIGN PATENT DOCUMENTS

CN          109891582 A *   6/2019   ....... H01L 21/76841

OTHER PUBLICATIONS

"Search Report of Europe Counterpart Application", issued on Jul. 26, 2022, p. 1-p. 11.

*Primary Examiner* — Telly D Green
(74) *Attorney, Agent, or Firm* — JCIP GLOBAL INC.

(57) ABSTRACT

The disclosure provides a chipset and a manufacturing method thereof. The chipset includes multiple logic cores and a memory chip. The logic cores respectively have a first device layer and a first substrate layer, and respectively include multiple first bonding elements and a first input/output circuit. The first bonding elements are provided in the first device layer. The first input/output circuit is provided in the first device layer. The memory chip has a second device layer and a second substrate layer, and includes second bonding elements and second input/output circuits. The second bonding elements are arranged in the second device layer. The second input/output circuits are arranged in the second device layer, and are respectively connected to the first input/output circuits of the logic cores.

16 Claims, 16 Drawing Sheets

(51) Int. Cl.
  *H01L 23/48*   (2006.01)
  *H01L 23/498*  (2006.01)

(56) References Cited

U.S. PATENT DOCUMENTS

| | | | |
|---|---|---|---|
| 10,672,743 B2* | 6/2020 | Teig | H01L 24/92 |
| 10,672,744 B2* | 6/2020 | Teig | H01L 24/32 |
| 10,672,745 B2* | 6/2020 | Teig | H01L 25/0657 |
| 10,748,851 B1* | 8/2020 | Wang | H10B 43/50 |
| 11,152,336 B2* | 10/2021 | Teig | H01L 25/50 |
| 11,205,619 B2* | 12/2021 | Wang | H01L 24/06 |
| 11,557,516 B2* | 1/2023 | DeLaCruz | H01L 21/8221 |
| 2018/0330993 A1* | 11/2018 | DeLaCruz | H01L 27/0688 |
| 2018/0331072 A1* | 11/2018 | Nequist | H01L 21/8221 |
| 2019/0123022 A1* | 4/2019 | Teig | H01L 25/0657 |
| 2019/0123023 A1* | 4/2019 | Teig | H01L 24/80 |
| 2019/0123024 A1* | 4/2019 | Teig | H01L 25/0657 |
| 2020/0203318 A1* | 6/2020 | Nequist | H01L 25/0657 |
| 2020/0227389 A1 | 7/2020 | Teig et al. | |
| 2020/0243455 A1* | 7/2020 | Wang | H10B 43/50 |
| 2020/0328151 A1 | 10/2020 | Sir et al. | |
| 2020/0335450 A1* | 10/2020 | Wang | H01L 24/20 |
| 2021/0104436 A1* | 4/2021 | DeLaCruz | H01L 25/0657 |
| 2021/0202445 A1* | 7/2021 | DeLaCruz | H01L 23/5286 |
| 2022/0068890 A1* | 3/2022 | Teig | H01L 24/92 |
| 2022/0173090 A1* | 6/2022 | Gomes | H01L 24/08 |

* cited by examiner

CHIPSET AND MANUFACTURING METHOD THEREOF

CROSS-REFERENCE TO RELATED APPLICATION

This application claims the priority benefit of China application serial no. 202110662127.X, filed on Jun. 15, 2021. The entirety of the above-mentioned patent application is hereby incorporated by reference herein and made a part of this specification.

BACKGROUND

Field of the Disclosure

The disclosure relates to a semiconductor device, in particular to a chipset and a manufacturing method thereof.

Description of Related Art

Nowadays, artificial intelligence (AI) computing and high-performance computing (HPC) require simultaneous use of an increasing number of logic cores and access to high-bandwidth and high-density memory. In view of the above, it is one of the major issues for practitioners of the field to find out how to realize a memory device with a large number of multiple logic cores and high-density memory.

However, the existing memory is designed by providing more memory chips on a large-area system on chip (SOC), and adopts network-on-chip (NoC) or mesh channel to connect these memory chips. The existing memory adopts an interposer layer or a fan-out packaged redistribution layer to connect the high bandwidth memory (HBM) and multiple dies of these logic cores. In this regard, the problems frequently found in existing memory devices may include, for example, low yield caused by a large-area system-on-chip, small area for arithmetic logic unit (ALU) because input/output circuits and mesh channels occupy too much space, excessively high power consumption of the memory, and the need for ubump to use a large-area system-on-a-chip for connection. In view of the foregoing, the disclosure provides solutions in the following embodiments to overcome the above shortcomings and realize a high-density memory.

SUMMARY OF THE DISCLOSURE

The disclosure is related to a chipset and a manufacturing method thereof, which can realize a chipset with high logic computing capability and high-density memory.

According to an embodiment of the disclosure, the chipset of the disclosure includes a plurality of logic cores and memory chips. The plurality of logic cores respectively have a first device layer and a first substrate layer. The plurality of logic cores respectively include a plurality of first bonding elements and a first input/output circuit. The plurality of first bonding elements are provided on the first device layer. The plurality of first bonding surfaces of the plurality of first bonding elements are of the same height as the first surface of the first device layer. The first input/output circuit is arranged in the first device layer. The memory chip has a second device layer and a second substrate layer. The memory chip includes a plurality of second bonding elements and a plurality of second input/output circuits. The plurality of second bonding elements are arranged in the second device layer. A plurality of second bonding surfaces of the plurality of second bonding elements are of the same height as the second surface of the second device layer. A plurality of second input/output circuits are arranged in the second device layer, and are respectively connected to the first input/output circuits of the plurality of logic cores. The first surface faces the second surface. A plurality of first bonding surfaces of a plurality of first bonding elements of the plurality of logic cores are respectively directly bonded to a plurality of second bonding surfaces of the plurality of second bonding elements of the memory chip in a pad-to-pad manner.

According to an embodiment of the disclosure, the method for manufacturing a chipset of the disclosure includes the following steps: manufacturing a logic core wafer, the logic core wafer includes a plurality of logic cores, and the logic core wafer has a first device layer and a first substrate layer; forming a plurality of first bonding elements and a first input/output circuit in the first device layer of each of the plurality of logic cores, the plurality of first bonding surfaces of the plurality of first bonding elements are of the same height as the first surface of the first device layer; dicing the logic core wafer into a plurality of dies with a plurality of logic cores; manufacturing a memory chip, the memory chip has a second device layer and a second substrate layer; forming a plurality of second bonding element and a plurality of second input/output circuits respectively connected to the first input/output circuits of the plurality of logic cores in the second device layer, the plurality of second bonding surfaces of the plurality of second bonding elements are of the same height as the second surface of the second device layer, and the first surface faces the second surface; and directly bonding the plurality of first bonding elements of the plurality of dies to the plurality of second bonding elements of the memory chip respectively in a pad-to-pad manner.

Based on the above, the chipset and the manufacturing method thereof in the disclosure can effectively save the circuit wiring space on the logic core, and by bonding multiple logic cores and memory chips in a die-to-die manner, a chipset having high logic computing capability with high-density memory can be realized.

In order to make the above-mentioned features and advantages of the disclosure more comprehensible, the following specific embodiments are described in detail in conjunction with the accompanying drawings.

DESCRIPTION OF EMBODIMENTS

Figure 1:
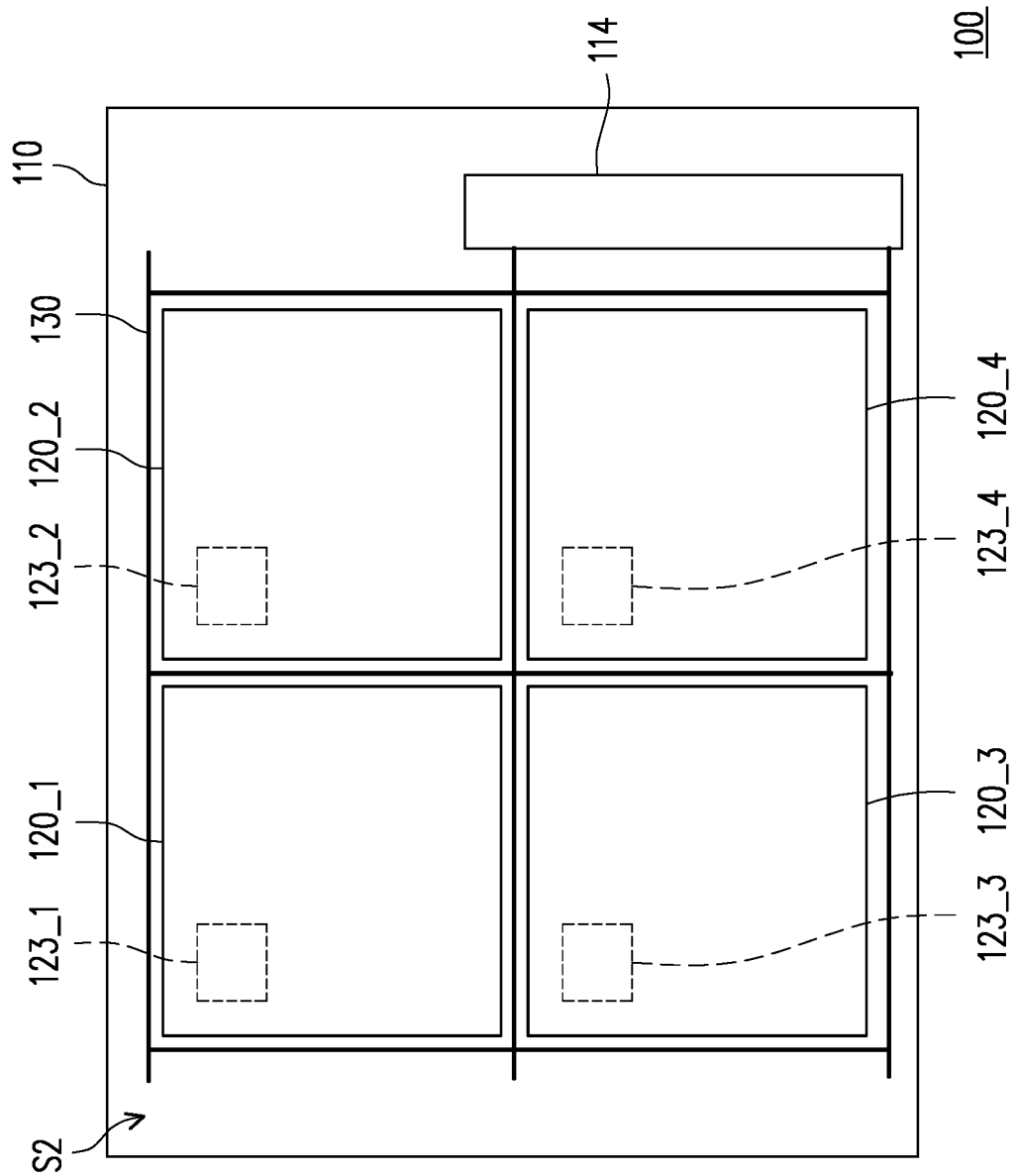
FIG. 1 is a schematic top view of a chipset according to a first embodiment of the disclosure.

Reference will now be made in detail to the exemplary embodiments of the disclosure, and examples of the exemplary embodiments are illustrated in the accompanying drawings. Whenever possible, the same component symbols are used in the drawings and descriptions to indicate the same or similar parts.

FIG. 1 is a schematic top view of a chipset according to a first embodiment of the disclosure. Referring to FIG. 1, the chipset 100 includes a memory chip 110, a plurality of logic cores 120_1 to 120_4, and a wiring 130, but the disclosure provides no limitation to the number of logic cores. The logic cores 120_1 to 120_4 may include input/output (IO) circuits 123_1 to 123_4, respectively. This embodiment is exemplified with four logic cores, but in other embodiments, the number of logic cores may be set freely. In this embodiment, the memory chip 110 may refer to a part of the wafer that has been subjected to wafer-dicing, and is formed with related memory circuit on the device layer of the wafer after undergoing a semiconductor process. In this embodiment, the memory chip 110 may include a dynamic random access memory (DRAM) and a static random-access memory (SRAM), a magnetoresistive random access memory (MRAM), a phase-change memory (PRAM), and a resistive random access memory (RRAM). In this embodiment, the surface S2 of the memory chip 110 may be provided with logic cores 120_1 to 120_4. The device layer of the memory chip 110 may be provided with a (metal) wiring 130 with a mesh structure and an input/output circuit 114. In this embodiment, the wiring 130 may be distributed around the logic cores 120_1 to 120_4 in the device layer below the surface S2, but the actual wiring method is not limited to that shown in FIG. 1. The input/output circuit 114 can realize the interconnection between the memory chip 110 and the multiple input/output circuits 123_1~123_4 of the multiple logic cores 120_1~120_4 through the wiring 130 and the internal circuit of the memory chip 110. The input/output circuit 114 can provide power signals and/or data signals to the memory chip 110 and the multiple input/output circuits 123_1~123_4 of the multiple logic cores 120_1~120_4 through the wiring 130 and the internal circuits of the memory chip 110. In this embodiment, the logic cores 120_1 to 120_4 are directly bonded to the memory chip 110 in a die-to-die manner. In this embodiment, the four logic cores 120_1 to 120_4 are only for exemplary purpose, and the disclosure provides no limitation to the number of logic cores.

Figure 2:
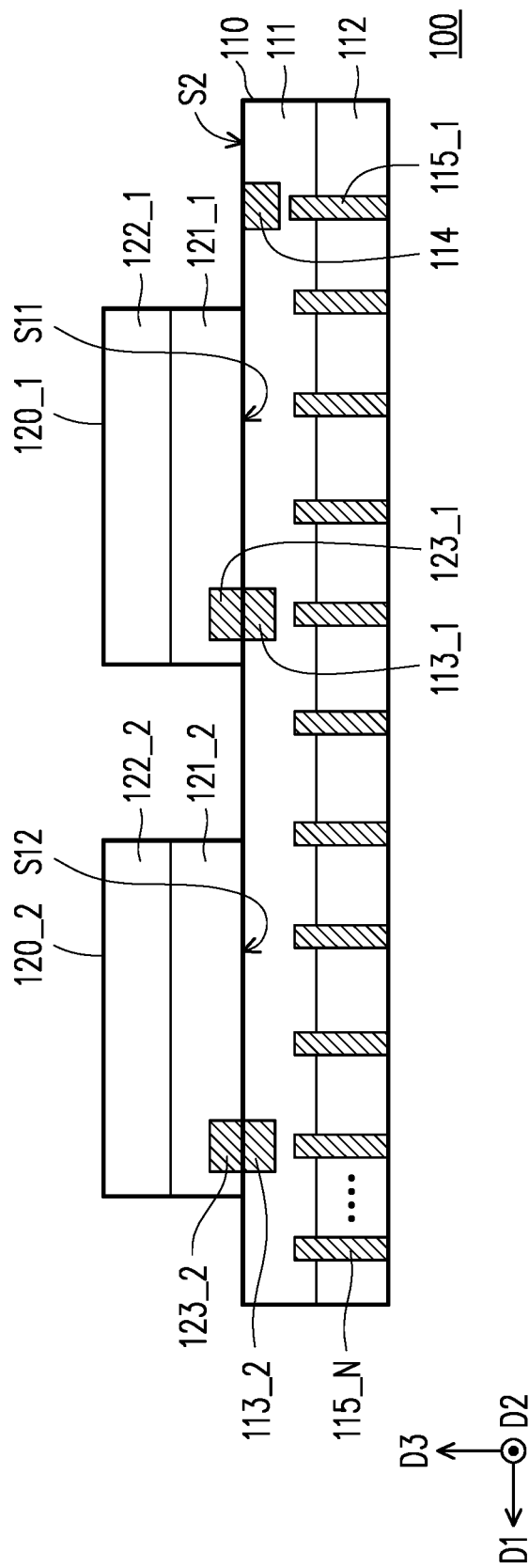
FIG. 2 is a schematic cross-sectional view of the chipset of the first embodiment of the disclosure.

FIG. 2 is a schematic cross-sectional view of the chipset of the first embodiment of the disclosure. Referring to FIG. 1 and FIG. 2, the memory chip 110 has a device layer 111 and a substrate layer 112. The memory chip 110 includes a plurality of bonding elements (not shown) and a plurality of input/output circuits 113_1, 113_2, and 114. A plurality of bonding elements (not shown) and input/output circuits 113_1, 113_2, and 114 are arranged in the device layer 111. The device layer 111 of the memory chip 110 may include functional circuits related to the memory. The logic cores 120_1 and 120_2 respectively have device layers 121_1 and 121_2 and substrate layers 122_1 and 122_2, and the logic cores 120_3 and 120_4 can be analogized to have the same structure as the logic cores 120_1 and 120_2. The device layers 121_1 and 121_2 of the logic cores 120_1 and 120_2 may respectively include related logic circuits. The logic cores 120_1 and 120_2 respectively include a plurality of bonding elements (not shown) and input/output circuits 123_1 and 123_2. A plurality of bonding elements and input/output circuits 123_1 and 123_2 are arranged in the device layers 121_1 and 121_2. It can be understood that, in the following embodiments of the disclosure, the substrate layer (for example, the substrate layers 112, 122_1, 122_2) may be a silicon substrate. In this embodiment, the input/output circuits 113_1 and 113_2 of the memory chip 110 can be connected to the bonding elements in the input/output circuits 123_1 and 123_2 of the logic cores 120_1 and 120_2 through the bonding elements provided inside them, so as to achieve transmission of data signals.

Figure 3:
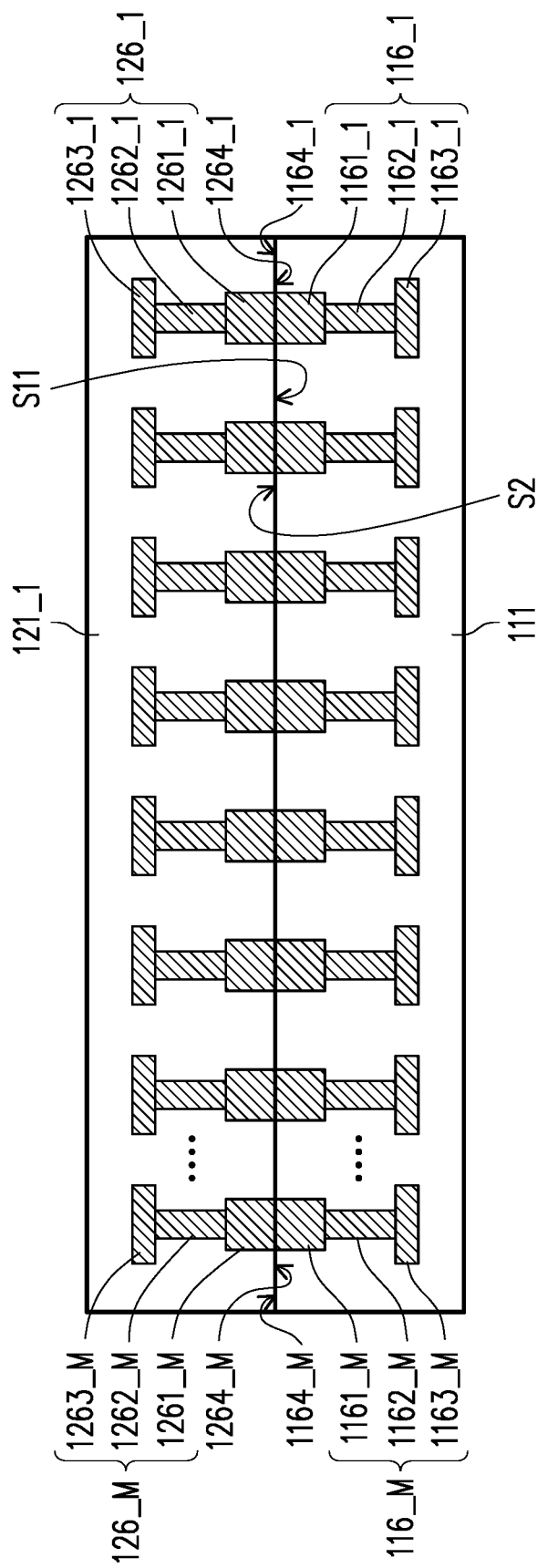
FIG. 3 is a schematic view of a hybrid bonding structure according to an embodiment of the disclosure.

Referring to FIG. 3 first, FIG. 3 is a schematic view of a hybrid bonding structure according to an embodiment of the disclosure. The memory chip 110 may include bonding elements 116_1 to 116_M, and M is a positive integer. The bonding elements 116_1 to 116_M are arranged in the device layer 111, and the bonding surfaces 1164_1 to 1164_M of the bonding elements 116_1 to 116_M are of the same height as the surface S11 of the device layer 111. Taking the logic core 120_1 as an example, the logic core 120_1 may include bonding elements 126_1 to 126_M, and the bonding surfaces 1264_1 to 1264_M of the bonding elements 126_1 to 126_M are of the same height as the surface S2 of the device layer 121_1. In this embodiment, the logic core 120_1 and the memory chip 110 can be bonded together through the bonding elements 116_1 to 116_M and the bonding elements 126_1 to 126_M in a hybrid bonding manner. In addition, the logic cores 120_2 to 120_4 can be inferred to have the same bonding element structure as the logic core 120_1.

The bonding surfaces 1264_1~1264_M of the bonding elements 126_1~126_M of the logic core 120_1 are directly bonded to the bonding surfaces 1164_1~1164_M of the bonding elements 116_1~116_M of the memory chip 110 through a hybrid bonding method in a pad to pad manner. The bonding elements 116_1~116_M and the bonding elements 126_1~126_M may include bonding pads 1161_1~1161_M and 1261_1~1261_M, pillars 1162_1~1162_M and 1262_1~1262_M, as well as metal pads 1163_1~1163_M and 1263_1~1263_M. The bonding pads 1161_1~1161_M and 1261_1~1261_M have bonding surfaces 1164_1~1164_M and 1264_1~1264_M. One end of the pillars 1162_1~1162_M and 1262_1~1262_M is connected with bonding pads 1164_1~1164_M and 1264_1~1264_M. The metal pads 1163_1~1163_M and 1263_1~1263_M are connected to the other ends of the pillars 1162_1~1162_M and 1262_1~1262_M. The materials of the bonding elements 116_1 to 116_M and the bonding elements 126_1 to 126_M include, but are not limited to, copper (Cu), aluminum (Al), or nickel (Ni). In this embodiment, at least a part of the bonding elements 116_1 to 116_M is used to transmit power signals and/or data signals through corresponding parts of the corresponding bonding elements 126_1 to 126_M.

Further referring to FIG. 1 and FIG. 2, in this embodiment, the memory chip 110 and the logic cores 120_1 and 120_2 can be bonded by the hybrid bonding method described above in FIG. 3 to realize the die-to-die bonding method in semiconductor process. Therefore, the input/output circuits 113_1 and 113_2 of the memory chip 110 can be connected to the part of corresponding bonding elements in the input/output circuits 123_1 and 123_2 of the logic cores 120_1 and 120_2 through a part of the bonding element so as to transmit control signals, data signals and operation instruction signals, etc., but the disclosure is not limited thereto. In this embodiment, the device layer 111 of the memory chip 110 may include circuit wiring, and the input/output circuits 113_1 to 113_2, and 114 may be connected to the circuit wiring. In this way, the logic cores 120_1 to 120_2 can communicate with the circuit wiring through the input/output circuits 123_1 to 123_2 and the input/output circuits 113_1 to 113_2. In this embodiment, the aforementioned circuit wiring is a metal wiring with a mesh structure or a network on chip (NOC)structure. Accordingly, the logic cores 120_1~120_4 of the chipset 100 of the present embodiment can effectively save the space for setting bumps to connect to the memory chip 110, and can increase the number of logic cores provided on the memory chip 110, so that the memory chip 110 can have a high-density arithmetic logic unit area.

In addition, in this embodiment, a part of the substrate layer 112 and the device layer 111 of the memory chip 110 includes a plurality of through silicon vias (TSV) 115_1~115_N, and N is a positive integer. The through silicon vias 115_1 to 115_N penetrate through the substrate layer 112 of the memory chip 110 and extend into at least a part of the device layer 111 to connect to the circuit wiring in the device layer 111. For example, the through silicon vias 115_1 to 115_N can be connected to the circuit wiring in the device layer 111 of the memory chip 110. In some embodiments, the through silicon vias may be respectively connected to the circuit wiring in the device layer 111 and the bonding elements 116_1 to 116_M through metal traces (not shown) in the device layer 111.

It should be understood that the through silicon vias may be a vertical interconnection structure filled with metal. The material of the filler metal includes but is not limited to copper (Cu) or tungsten (W). In some embodiments, a diffusion barrier layer (not shown) is further provided between the through silicon vias and the substrate layer as well as the device layer to prevent the diffusion of metal materials.

Figure 4:
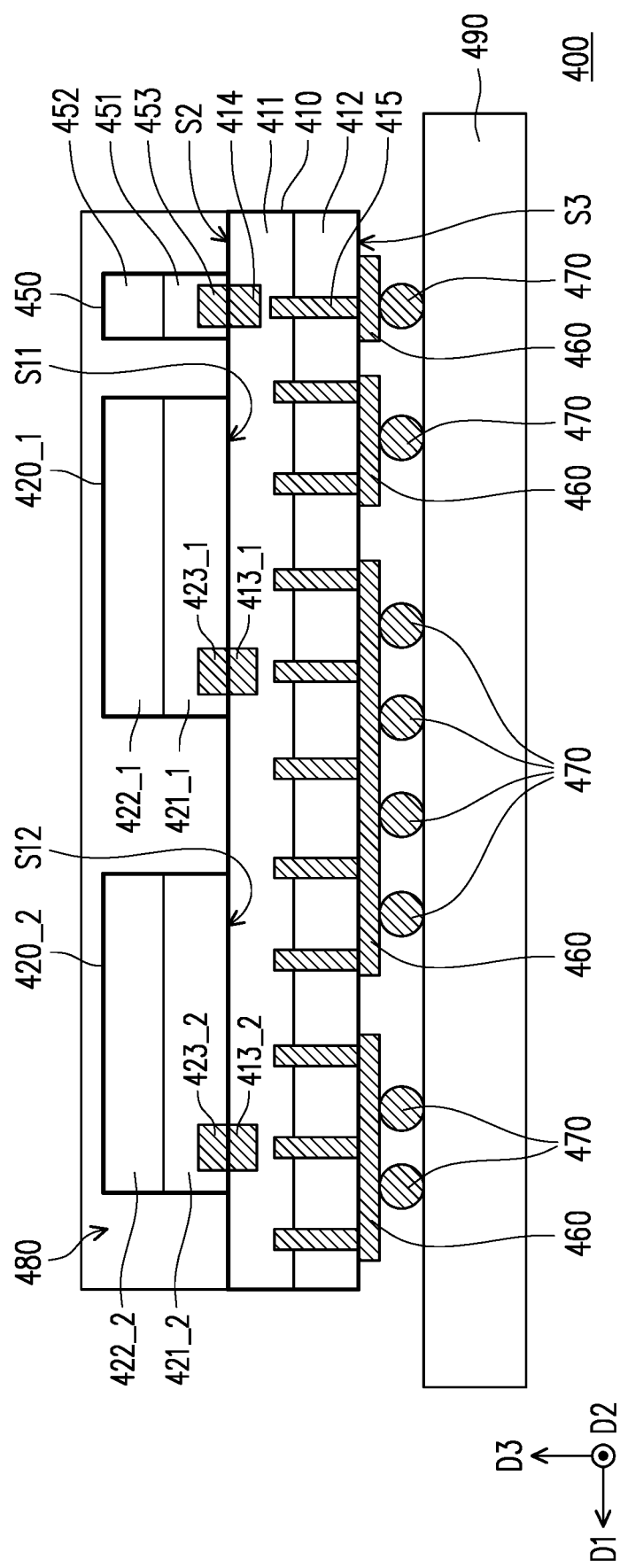
FIG. 4 is a schematic cross-sectional view of a chipset according to a second embodiment of the disclosure.

FIG. 4 is a schematic cross-sectional view of a chipset according to a second embodiment of the disclosure. Referring to FIG. 4, the chipset 400 includes a memory chip 410, logic cores 420_1 and 420_2, an input/output chip 450, and a packaging substrate 490. The memory chip 410 includes a plurality of bonding elements (not shown) and a plurality of input/output circuits 413_1, 413_2, and 414. The plurality of bonding elements and the input/output circuits 413_1 and 413_2 are provided in the device layer 411. The logic cores 420_1 and 420_2 respectively have device layers 421_1 and 421_2 as well as substrate layers 422_1 and 422_2, and the logic cores 420_3 and 420_4 can be analogized to have the same structure as the logic cores 420_1 and 420_2. The logic cores 420_1 and 420_2 respectively include the plurality of bonding elements (not shown) and the input/output circuits 423_1 and 423_2. The plurality of bonding elements and the input/output circuits 423_1 and 423_2 are arranged in the device layers 421_1 and 421_2. In this embodiment, the input/output circuits 413_1 and 413_2 of the memory chip 410 can be connected to the bonding elements in the input/output circuits 423_1 and 423_2 of the logic cores 420_1 and 420_2 through the bonding elements provided inside them, respectively, so as to be directly bonded to the memory chip 410 in a die-to-die manner. In the embodiment, the bonding method of the memory chip 410 and the logic cores 420_1 and 420_2 can be derived from the description of the embodiments shown in FIG. 1 to FIG. 3, and no further description is incorporated herein.

Compared with the above-mentioned embodiment in FIG. 3, this embodiment further adds an input/output chiplet (IO chiplet) on a 3D stack structure. Specifically, in this embodiment, the input/output chip 450 includes a device layer 451 and a substrate layer 452, and the device layer 451 is provided with an input/output circuit 453. The input/output circuit 414 of the memory chip 410 is connected to the input/output circuit 453 of the input/output chip 450, and the connection method can be implemented in a die-to-die manner as described above. The input/output chip 450 and the memory chip 410 can be directly bonded in a pad-to-pad manner. For example, the device layer 451 of the input/output chip 450 and the device layer 411 of the memory chip 410 may be bonded in a hybrid bonding manner. The description of hybrid bonding may be derived from the description of the above-mentioned embodiments in FIG. 1 to FIG. 3, and no further description is incorporated herein. In this embodiment, the chipset 400 may further include a fan-out packaged redistribution layer (RDL)460. The redistribution layer 460 is disposed on the surface S3 of the memory chip 410, and the surface S3 is opposite to the surface S2. In this embodiment, the redistribution layer 460 is connected to a plurality of through silicon vias 415. The through silicon via 415 penetrates the substrate layer 412 and extends into at least a part of the device layer 411, and the through silicon via 415 is connected to the circuit wiring in the device layer 411 and a plurality of bonding elements. After the memory chip 410, the logic cores 420_1 and 420_2, the input/output chip 450, and the redistribution layer 460 are processed through related processes and packaging processes, a dielectric layer 480 can be formed on the surface S2 of the memory chip 410 to cover the logic cores 420_1 and 420_2, and the redistribution layer 460 may be bonded to the packaging substrate 490 through a plurality of bumps 470. In this embodiment, the input/output chip 450 may be, for example, a Serdes IO chiplet or a driver circuit chip. It can be understood that the redistribution layer 460 may be one layer or multiple layers, and the disclosure provides no limitation thereto. The input/output chip 450 can provide data signals and/or power signals to the memory chip 410 and the logic cores 420_1 and 420_2 through the input/output circuit 453. The memory chip 410, the logic cores 420_1 and 420_2, and the input/output chip 450 can communicate with other circuits and/or other chips on the packaging substrate 490 through the redistribution layer 460 and the bump 470. Therefore, the memory chip 410, the logic cores 420_1 and 420_2, and the input/output chip 450 of the chipset 400 of the present embodiment can effectively save the space for arranging bumps to connect to the memory chip 410, and can increase the number of logic cores provided on the memory chip 410 to realize a high-density arithmetic logic unit area.

Figure 5:
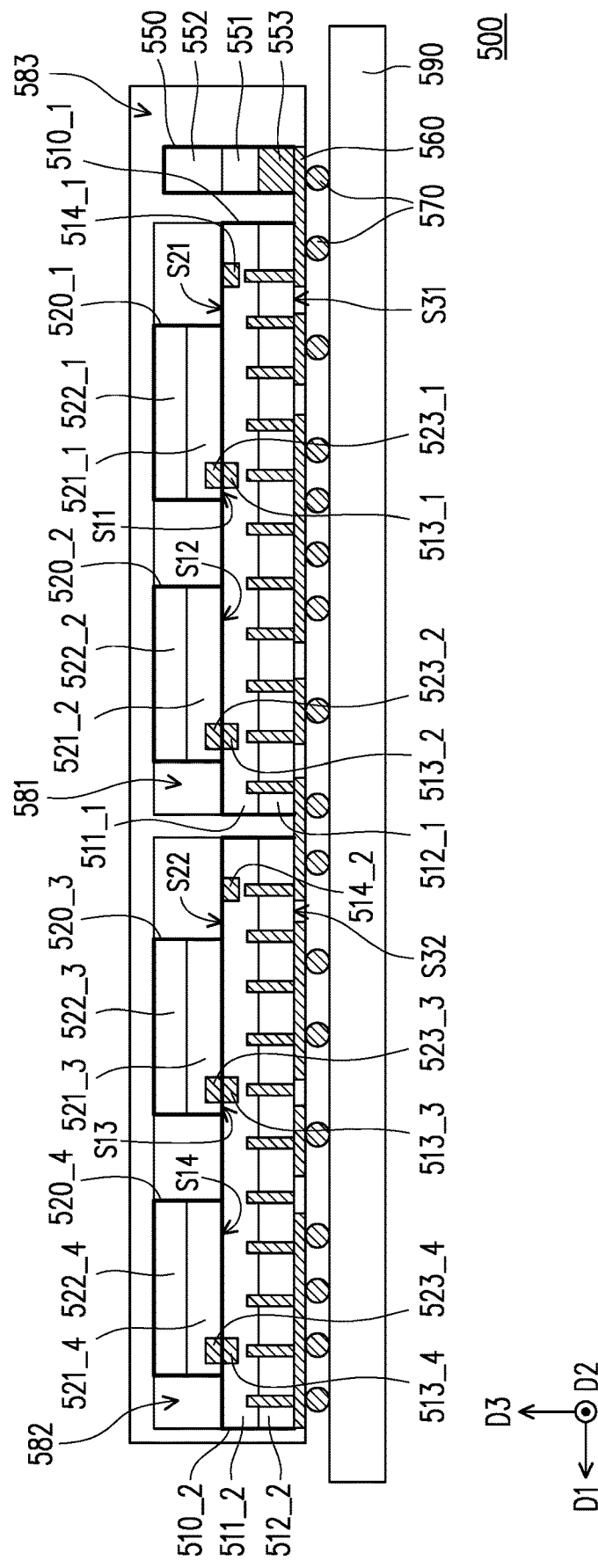
FIG. 5 is a schematic cross-sectional view of a chipset according to a third embodiment of the disclosure.

FIG. 5 is a schematic cross-sectional view of a chipset according to a third embodiment of the disclosure. Referring to FIG. 5, the chipset 500 includes memory chips 510_1 and 510_2, logic cores 520_1 to 520_4, an input/output chip 550, a redistribution layer 560, a bump 570, dielectric layers 581 to 583, and a packaging substrate 590. The memory chips 510_1 and 510_2 respectively include a plurality of bonding elements (not shown) and a plurality of input/output circuits 513_1 to 513_4, 514_1, and 514_2. A plurality of bonding elements and input/output circuits 513_1 to 513_4, 514_1, and 514_2 are provided in the device layers 511_1 and 511_2. The logic cores 520_1 to 520_4 respectively have device layers 521_1 to 521_4 and substrate layers 522_1 to 522_4. The logic cores 520_1 to 520_4 respectively include a plurality of bonding elements (not shown) and input/output circuits 523_1 to 523_4. A plurality of bonding elements and input/output circuits 523_1 to 523_4 are arranged in the device layers 521_1 to 521_4. In this embodiment, the input/output circuits 513_1 to 513_4 of the memory chips 510_1 and 510_2 can be connected to the bonding elements in the input/output circuits 523_1 to 523_4 of the logic cores 520_1 to 520_4 through the bonding elements provided therein, and directly bonded to the memory chips 510_1 and 510_2 in a die-to-die manner. The redistribution layer 560 is disposed on the surfaces S31 and S32 of the substrate layers 512_1 and 512_2 of the memory chips 510_1 and 510_2. The bonding method of the memory chips 510_1 and 510_2 and the logic cores 520_1 to 520_4 and the arrangement of the redistribution layer 560 and the bump 570 of this embodiment can be derived from the description of the embodiments in FIG. 1 to FIG. 4, and no further description is incorporated herein.

Compared with the above-mentioned embodiment in FIG. 4, the chipset 500 of this embodiment has additional input/output chiplets, and can be additionally integrated with another memory chip. Specifically, in this embodiment, the memory chips 510_1 and 510_2 may be connected through the redistribution layer 560. The redistribution layer 560 can be connected to a plurality of through silicon vias 515_1 and 515_2 of the memory chips 510_1 and 510_2, respectively. The through silicon vias 515_1 and 515_2 penetrate the substrate layers 512_1 and 512_2 and extend into at least part of the device layers 511_1 and 511_2, and the through silicon via 415 is connected to the circuit wiring in the device layer 411 and a plurality of bonding elements. The input/output chip 550 includes a device layer 551 and a substrate layer 552, and the device layer 551 is provided with an input/output circuit 553. The redistribution layer 560 is further connected to the input/output circuit 553 of the input/output chip 550. In this embodiment, after the memory chips 510_1 and 510_2, the logic cores 520_1 to 520_4, the input/output chip 550, and the redistribution layer 560 are processed through related processes and packaging process, a dielectric layer 581 may be formed on the chip consisting of the memory chip 510_1 and the logic cores 520_1 and 520_2 to cover the logic cores 520_1 and 520_2, and a dielectric layer 582 may be formed on the chip consisting of the memory chip 510_2 and the logic cores 520_3 and 520_4. A dielectric layer 583 can be further formed around the dielectric layers 581 and 582 of the two chipsets to cover the dielectric layers 581 and 582, and the dielectric layers 581 to 583 can be made of the same or different dielectric materials. The disclosure is not limited thereto. The redistribution layer 560 may be bonded to the packaging substrate 590 through a plurality of bumps 570. It can be understood that the redistribution layer 560 may be one layer or multiple layers, and the disclosure is not limited thereto. The input/output chip 550 can provide data signals and/or power signals to the memory chips 510_1 and 510_2 and the logic cores 520_1 to 520_4 through the input/output circuit 553. The memory chips 510_1 and 510_2, the logic cores 520_1 to 520_4, and the input/output chip 550 can communicate with other circuits and/or other chips on the packaging substrate 590 through the redistribution layer 560 and the bump 570. Therefore, the memory chips 510_1 and 510_2 of the chipset 500 of this embodiment can be integrated into the same memory device while saving more space, and the memory chips 510_1 and 510_2, the logic cores 520_1~520_4, and the input/output chip 550 can effectively save the space for arranging the bumps to connect to the memory chip 510, and can increase the number of logic cores provided on the memory chip 510, so that a high-density arithmetic logic unit area can be realized.

Figure 6:
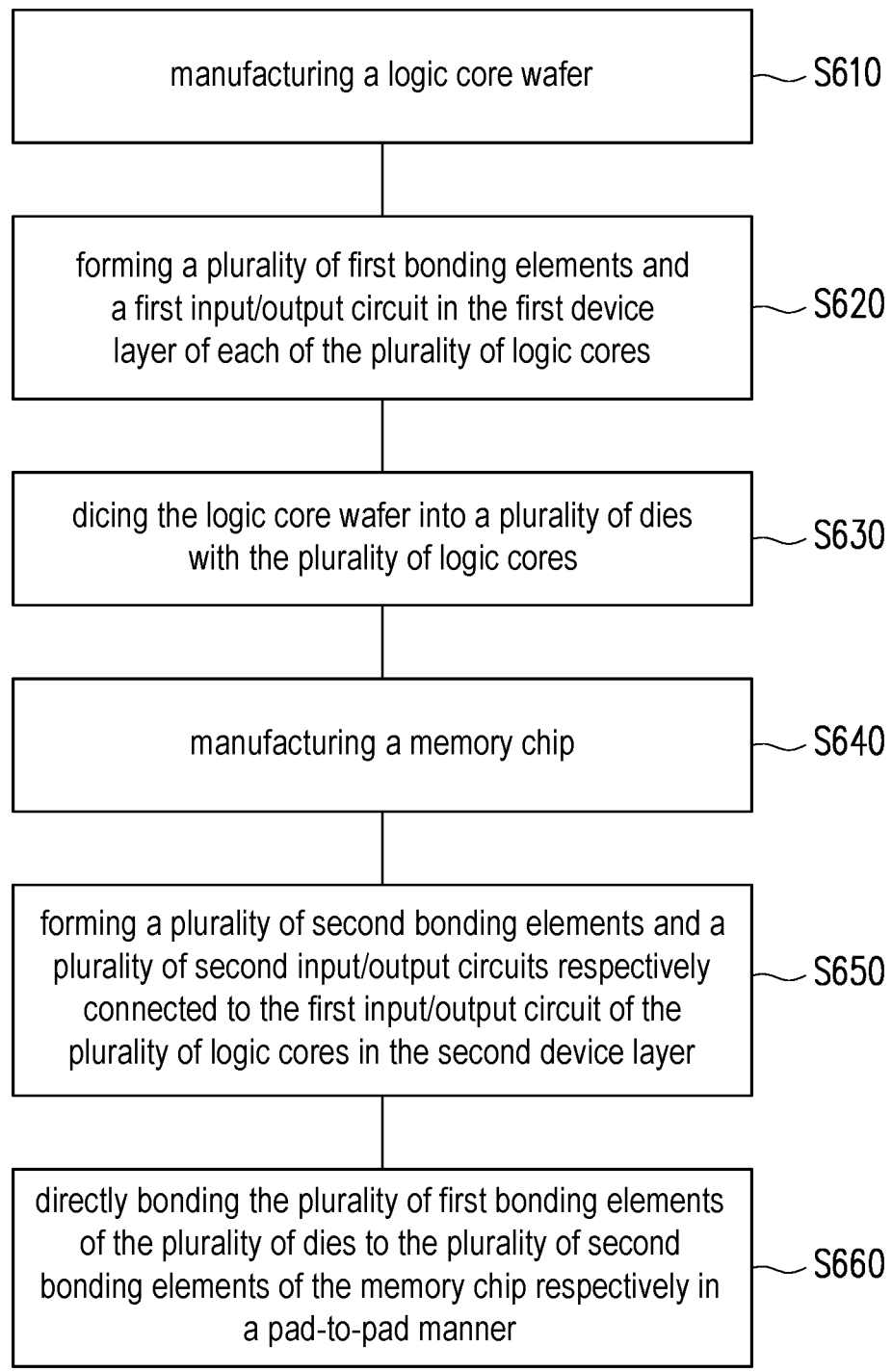
FIG. 6 is a flowchart of a manufacturing method of a chipset according to an embodiment of the disclosure.
Figure 7A:
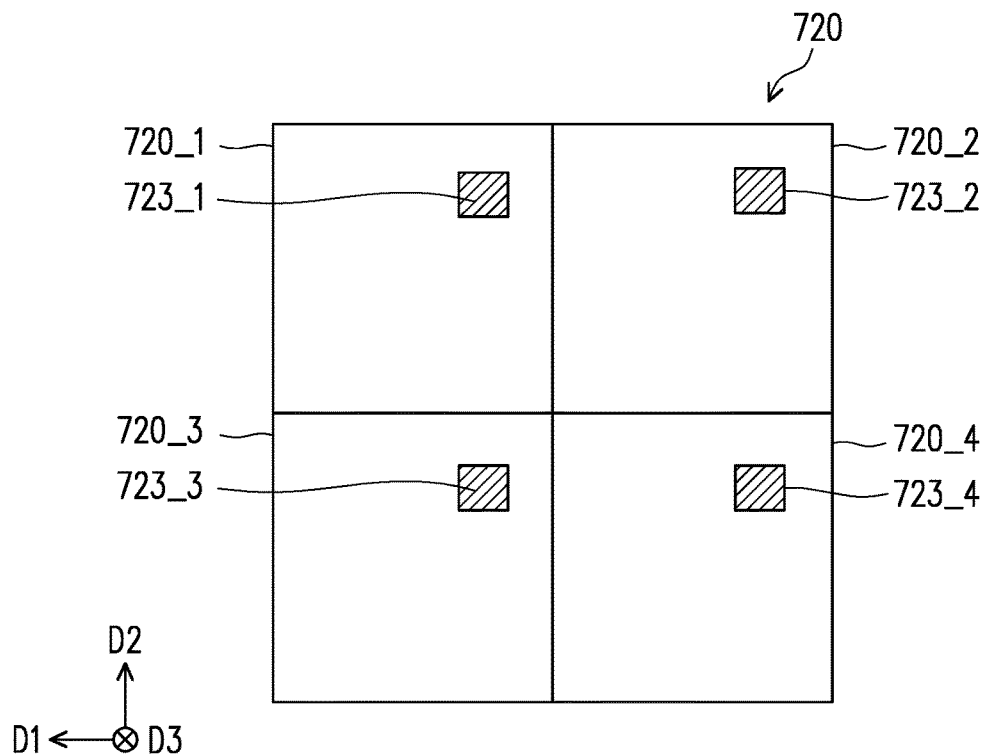
FIG. 7A to FIG. 7C are schematic views showing manufacturing multiple logic cores according to an embodiment of the disclosure.
Figure 7B:
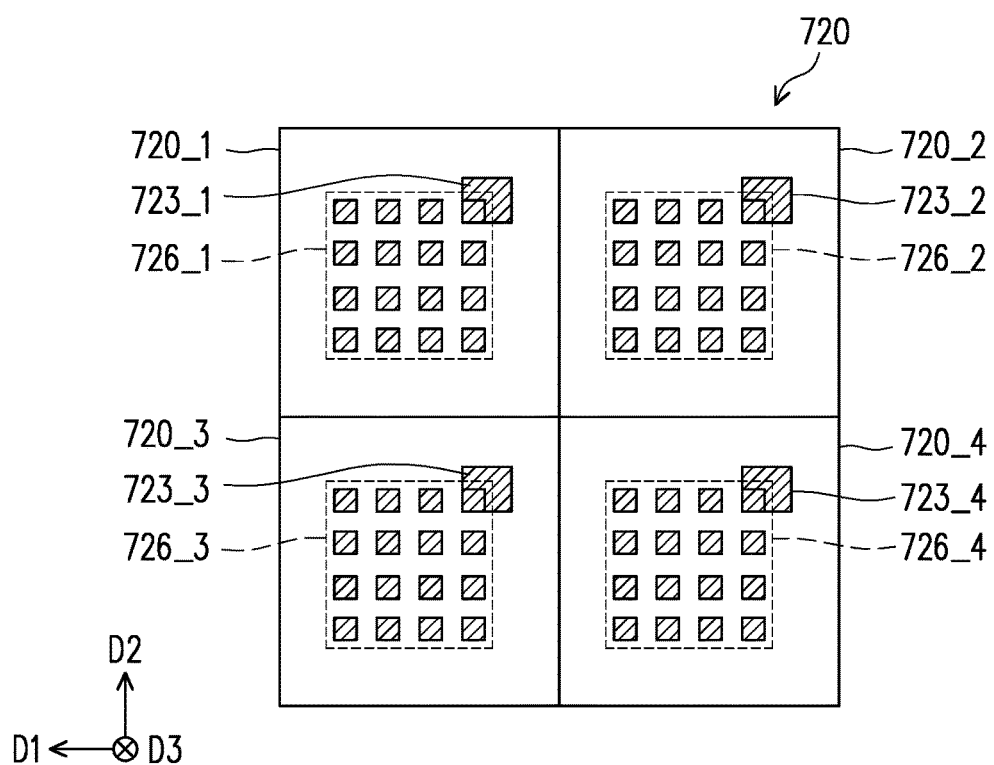
Figure 7C:
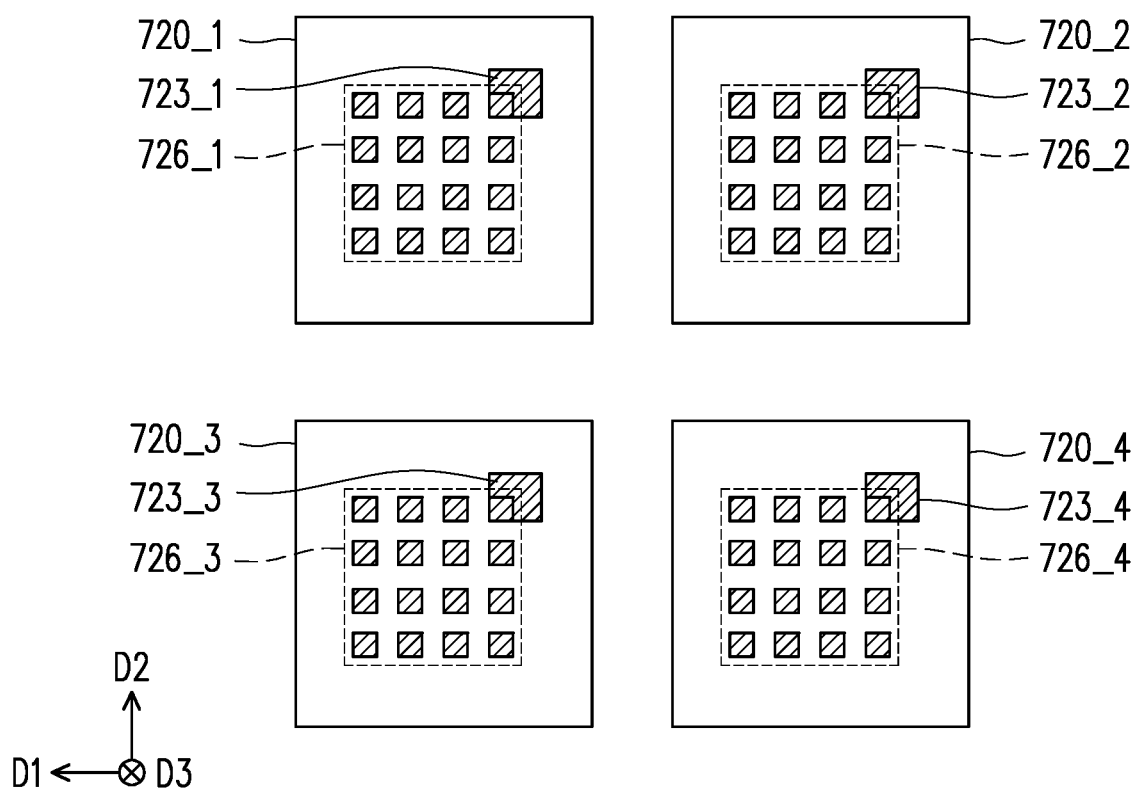

FIG. 6 is a flowchart of a manufacturing method of a chipset according to an embodiment of the disclosure. Referring to FIG. 6, the manufacturing method of the memory of this embodiment can be implemented through the following steps S610 to S660. With reference to FIG. 7A to FIG. 7C, FIG. 7A to FIG. 7C are schematic views showing manufacturing multiple logic cores according to an embodiment of the disclosure. In step S610, a logic core wafer 720 is manufactured. As shown in FIG. 7A, the core wafer 720 includes logic cores 720_1 to 720_4, and the logic core wafer 720 has a device layer and a substrate layer. The technical features of the device layer and the substrate layer of the logic core wafer 720 can be derived from the description of the foregoing embodiments. In step S620, bonding elements and input/output circuits 723_1 to 723_4 are formed in the device layer of each of the logic cores 720_1 to 720_4. As shown in FIG. 7A, the input/output circuits 723_1 to 723_4 are formed in the device layer of each of the logic cores 720_1 to 720_4, and the configuration position of the input/output circuit of the logic core wafer 720 of the disclosure is not limited to the illustration shown in FIG. 7A to FIG. 7C. As shown in FIG. 7B, the device layer of each of the logic cores 720_1 to 720_4 can respectively form bonding element groups 726_1 to 726_4 having multiple bonding elements, and the configuration position of the bonding element of the disclosure is not limited to the illustration shown in FIG. 7B to FIG. 7C. In some examples, the bonding element groups 726_1 to 726_4 may also be evenly distributed in the entire device layer of the device layer of each of the logic cores 720_1 to 720_4. The technical features of the input/output circuits 723_1 to 723_4 and the bonding element can be derived from the description in the foregoing embodiments. In step S630, the logic core wafer 720 is diced into a plurality of dies having a plurality of logic cores 720_1 to 720_4. As shown in FIG. 7C, the logic core wafer 720 can be diced into multiple dies of logic cores 720_1 to 720_4, and one die corresponds to one logic core.

Figure 8A:
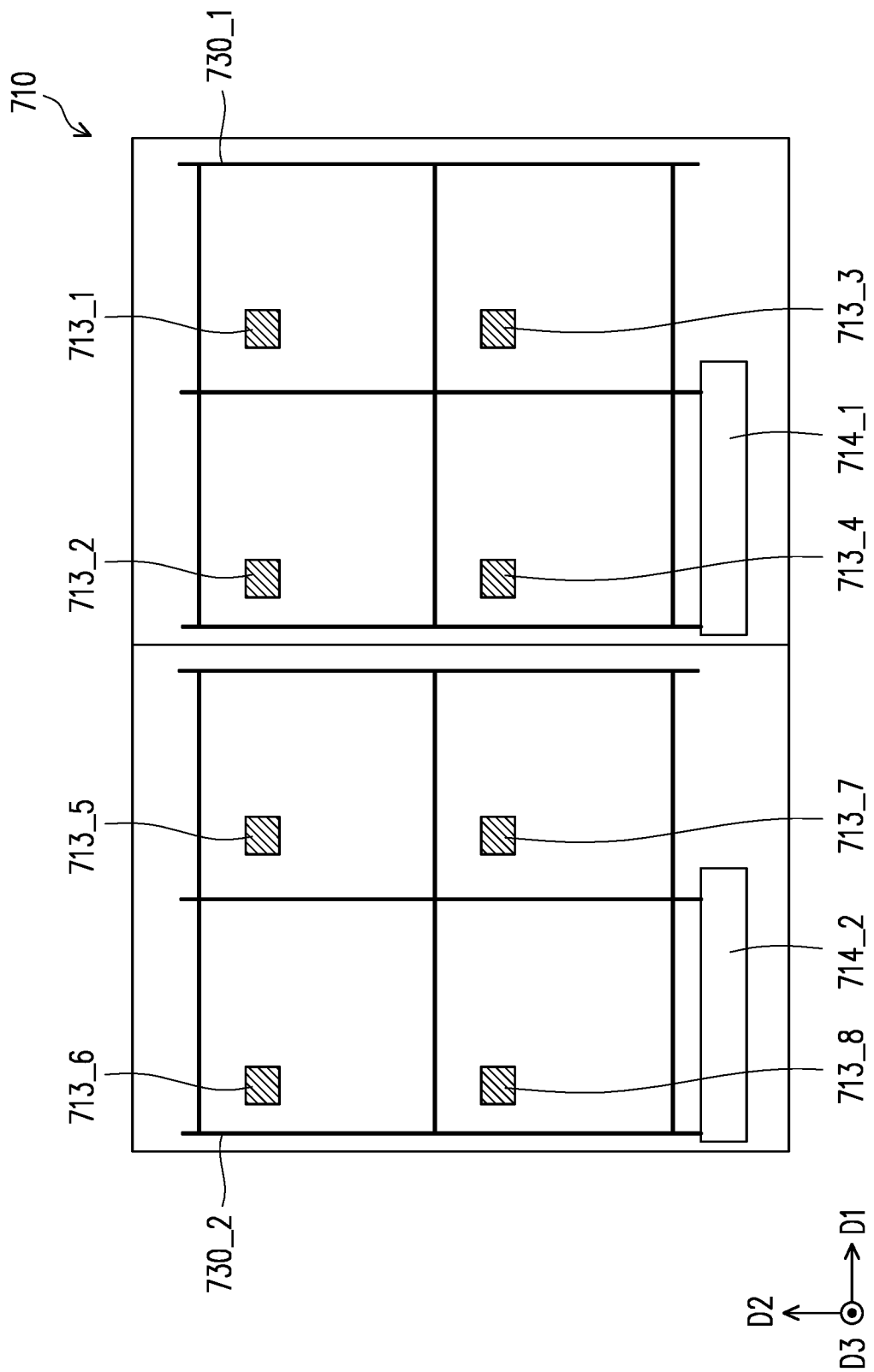
FIG. 8A to FIG. 8C are schematic views showing manufacturing a memory chip according to an embodiment of the disclosure.
Figure 8B:
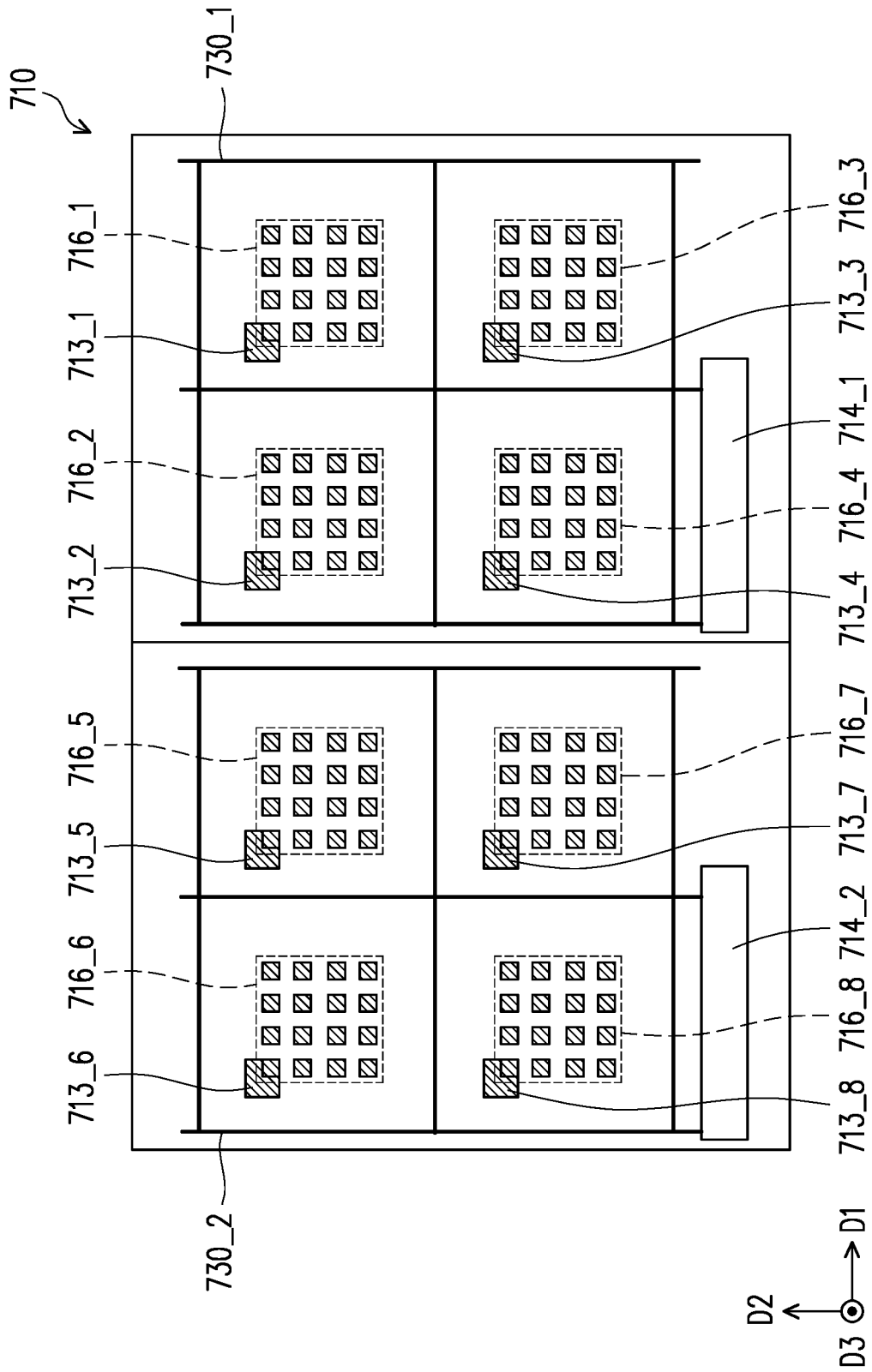
Figure 8C:
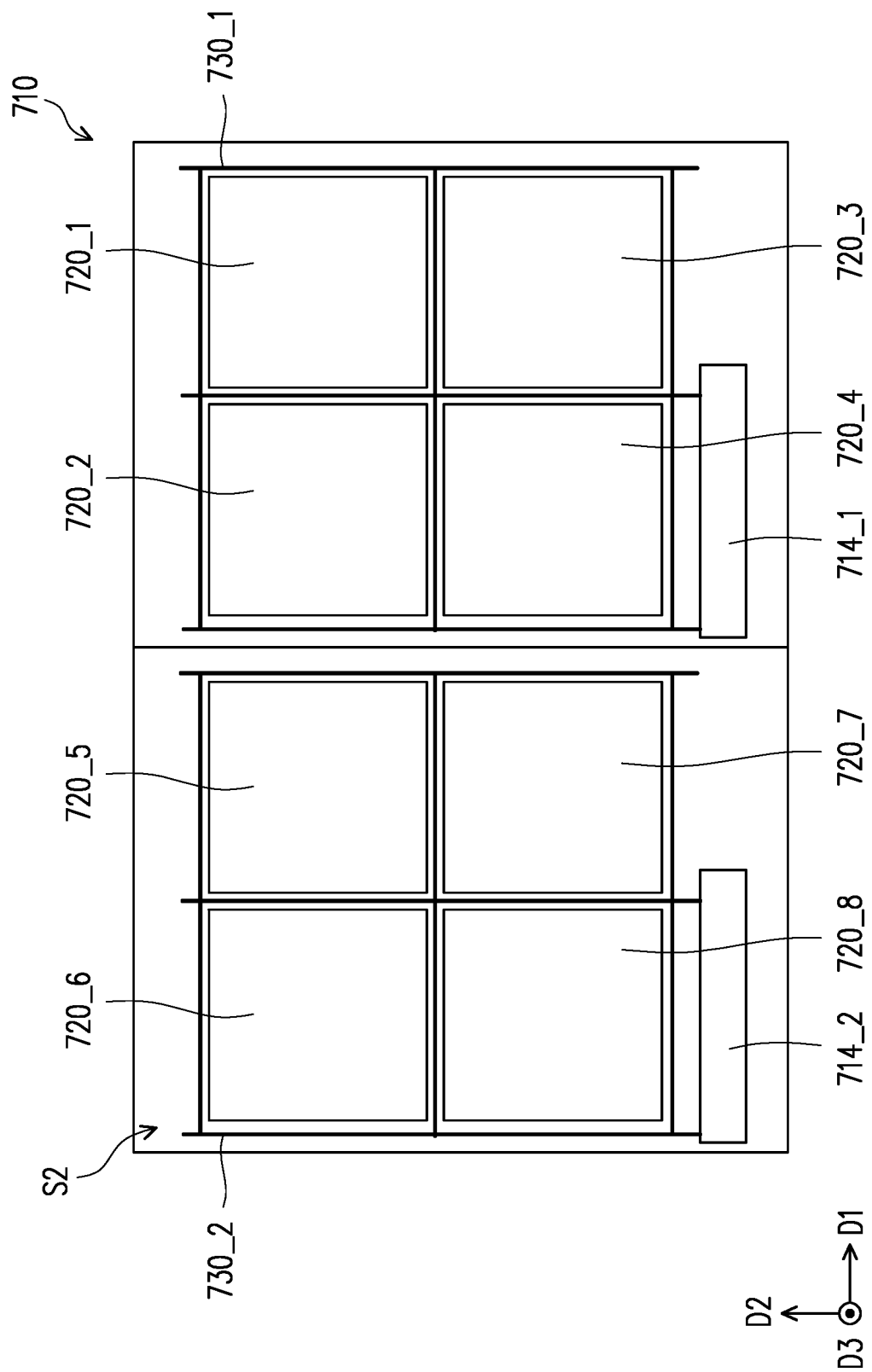

With reference to FIG. 8A to FIG. 8C, FIG. 8A to FIG. 8C are schematic views showing manufacturing a memory chip according to an embodiment of the disclosure. In step S640, the memory chip 710 is manufactured. As shown in FIG. 8A, the memory chip 710 can be partitioned, and (metal)wiring 730_1 and 730_2 with a mesh structure and the input/output circuits 714_1 and 714_2 can be formed in the device layer of the memory chip 710. The memory chip 710 has a device layer and a substrate layer. The technical features of the device layer and the substrate layer of the memory chip 710 can be derived from the description of the foregoing embodiments. In step S650, a plurality of bonding elements and a plurality of input/output circuits 713_1 to 713_8 respectively connected to the input/output circuits 723_1 to 723_4 of the logic cores 720_1 to 720_4 are formed in the device layer. As shown in FIG. 8A, the input/output circuits 713_1 to 713_8 are formed in the device layer of each of the multiple regions of the memory chip 710, and the configuration position of the input/output circuit of the memory chip 710 of the disclosure is not limited to the illustration shown in FIG. 8A and FIG. 8B. As shown in FIG. 8B, the device layer of each of the multiple regions of the memory chip 710 can respectively form bonding element groups 713_1 to 713_8 having a plurality of bonding elements, and the configuration position of the bonding element of the disclosure is not limited to the illustration shown in FIG. 7B. The technical features of the input/output circuits 713_1 to 713_8 and the bonding element may be derived from the description of the foregoing embodiments. In addition, in the manufacturing process, circuit wiring can be formed in the device layer of the memory chip 710, and multiple input/output circuits 713_1 to 713_8 can be connected to the circuit wiring. In step S660, the multiple bonding elements of the multiple dies are directly bonded to the multiple bonding elements of the memory chip 710 in a pad-to-pad manner. As shown in FIG. 8C, the multiple dies of the logic cores 720_1 to 720_8 can be arranged face-to-face on multiple regions of the memory chip 710 in an upside-down manner, and are bonded to the memory chip 710 by hybrid bonding to form the chipset 700.

In other embodiments of the disclosure, during the manufacturing process, another input/output circuit may be formed in the device layer of the memory chip 710, and the input/output chip can be manufactured. In this regard, an input/output circuit can be formed on the input/output chip, and the other input/output circuit of the memory chip 710 can be connected to the input/output circuit of the input/output chip.

Figure 9A:
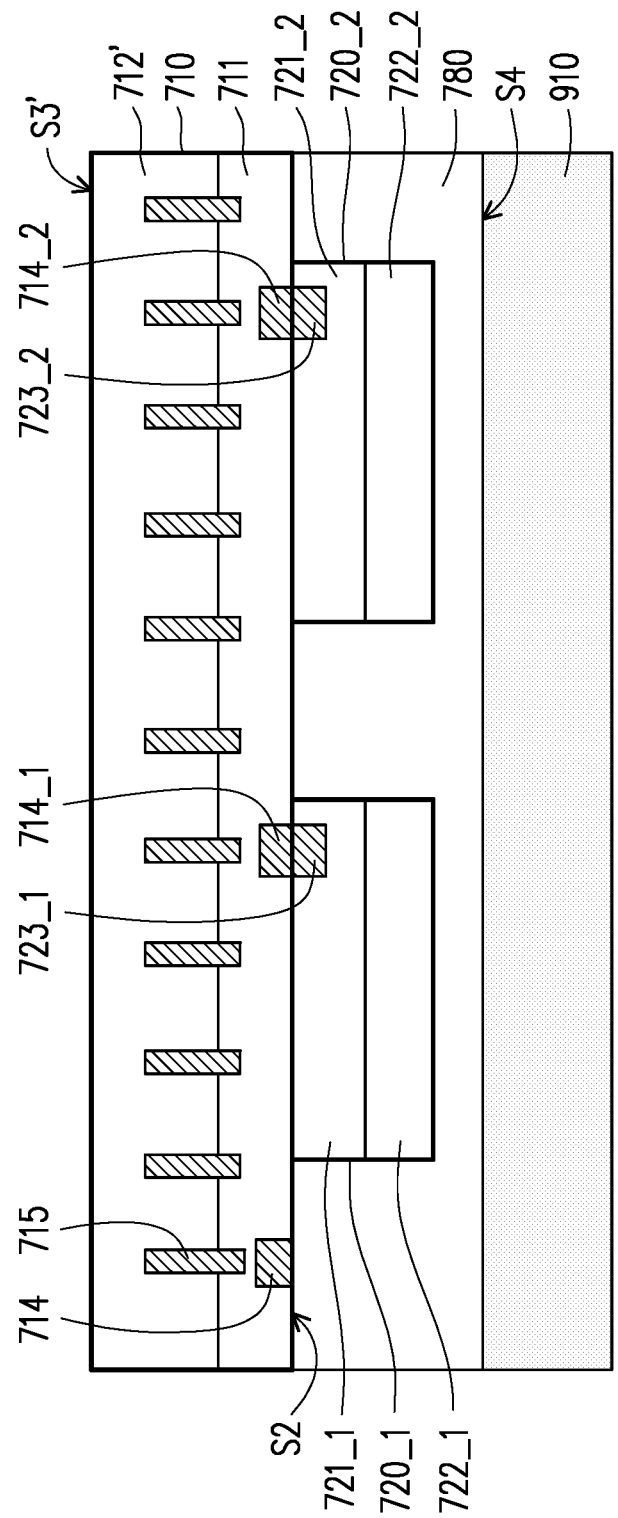
FIG. 9A to FIG. 9E are schematic views showing manufacturing a chipset according to an embodiment of the disclosure.
Figure 9B:
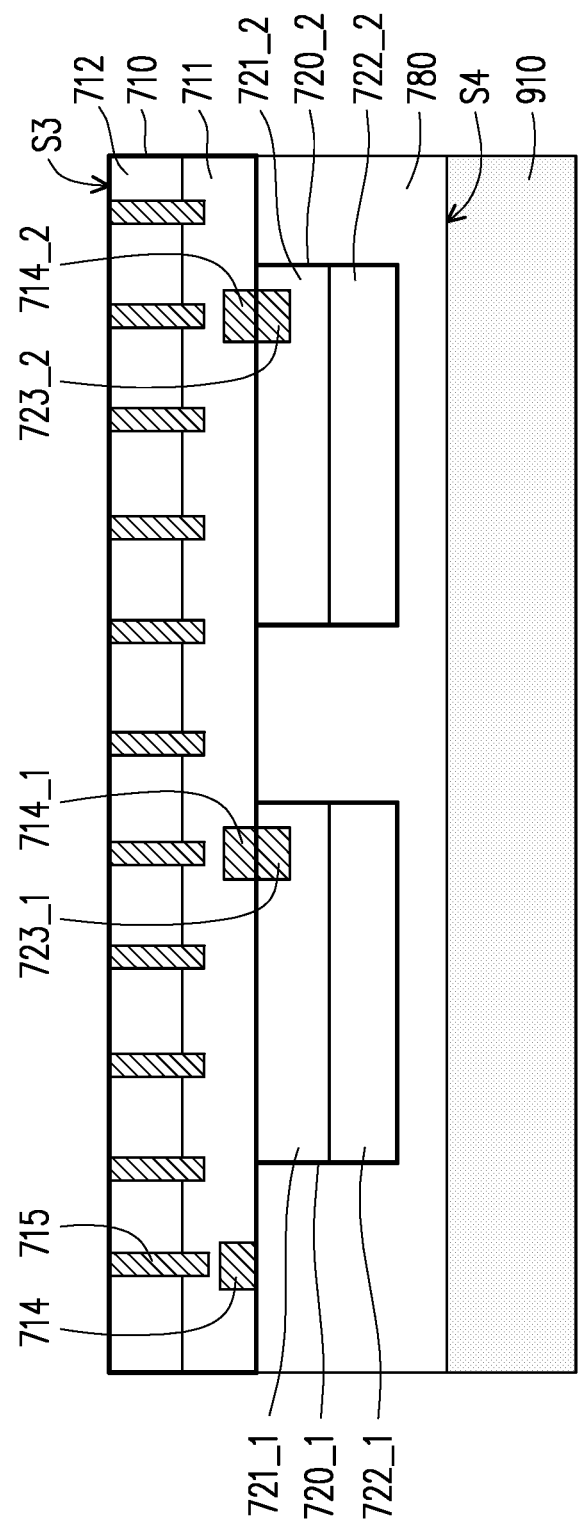
Figure 9C:
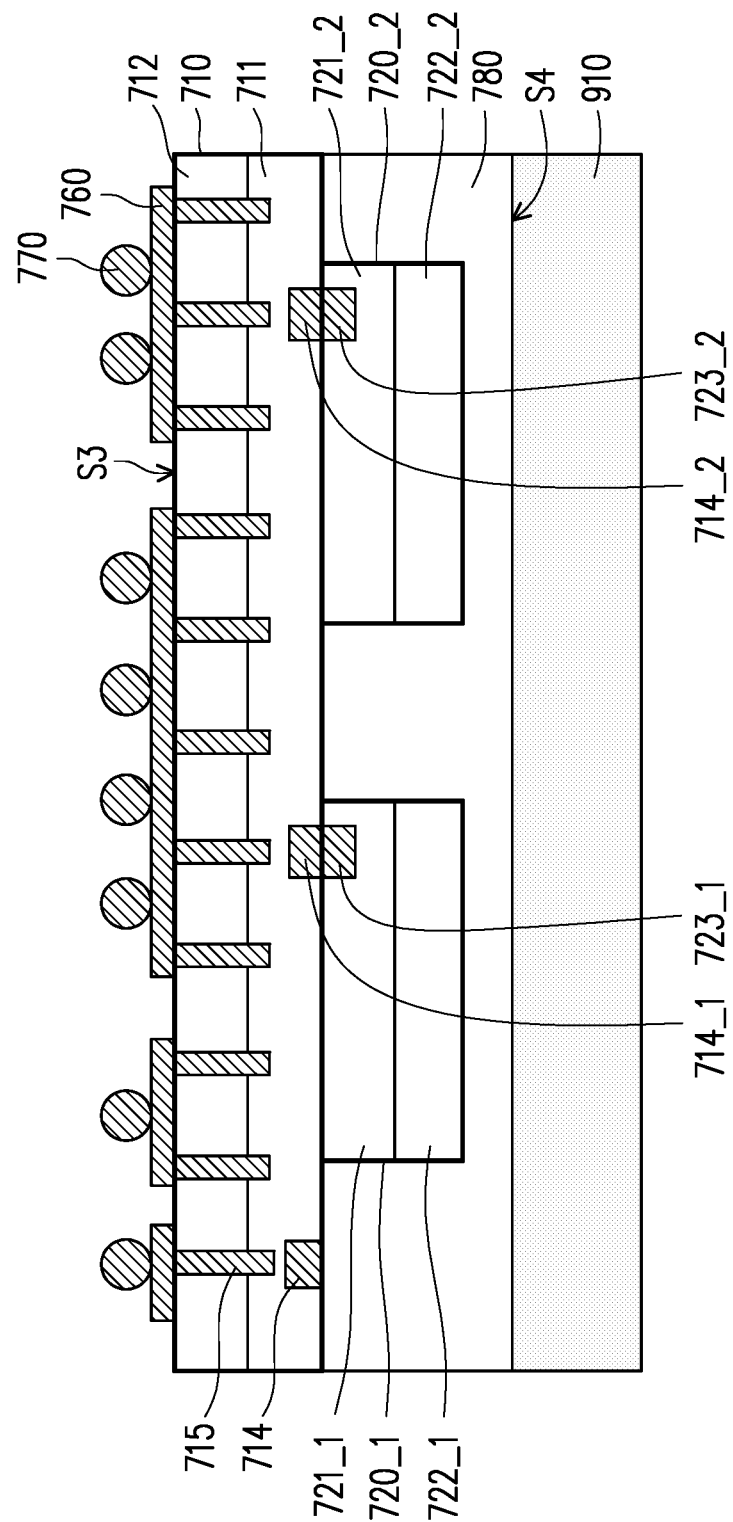
Figure 9D:
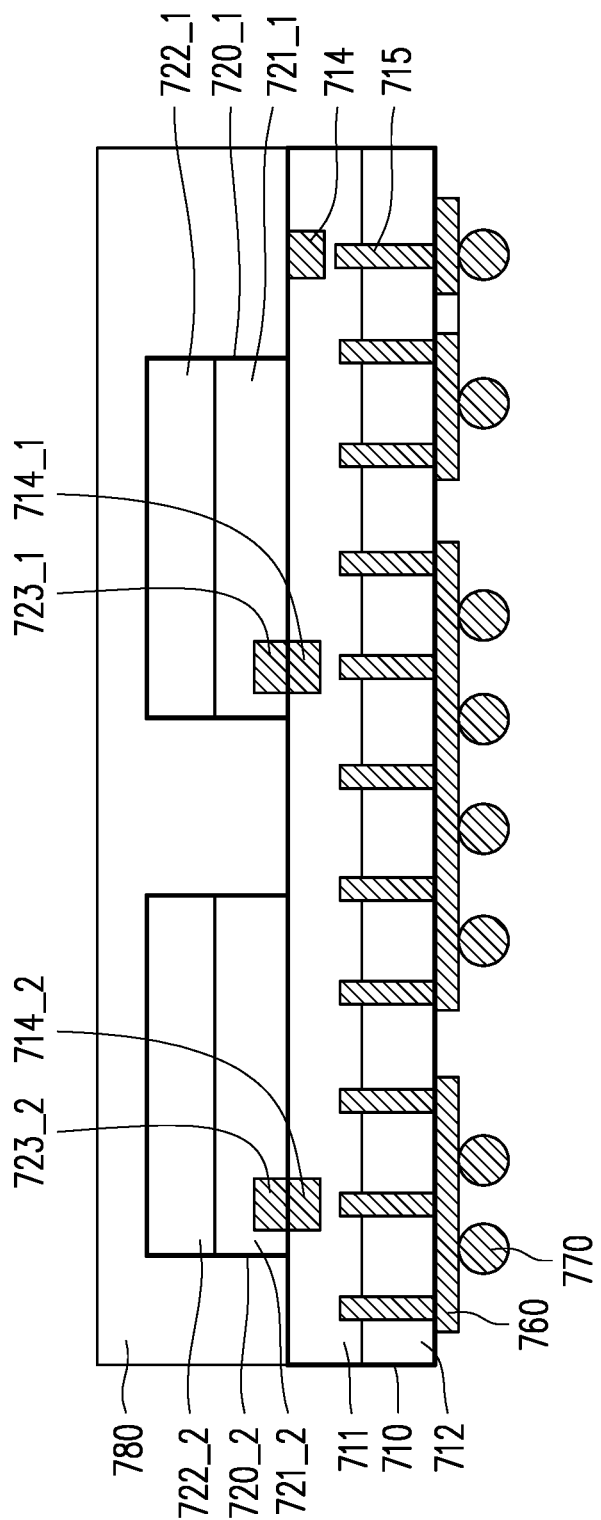
Figure 9E:
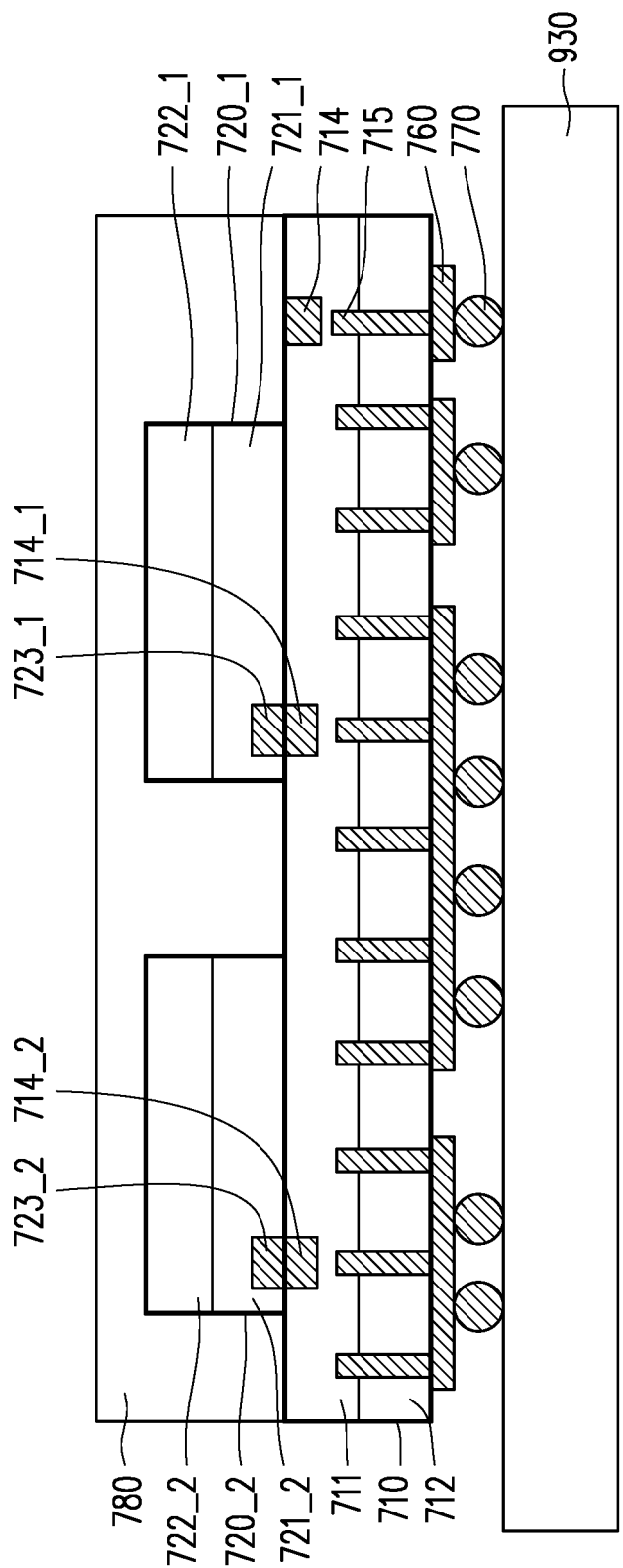

FIG. 9A to FIG. 9E are schematic views showing manufacturing a chipset according to an embodiment of the disclosure. The chipset 700 shown in FIG. 8C can be continuously executed to perform the packaging process as shown in FIG. 9A to FIG. 9E. Referring to FIG. 9A, the chipset 700 may form a dielectric layer 780 on the surface S2 of the memory chip 710 to cover the logic cores 720_1 to 720_8, and the surface S4 of the dielectric layer 780 is disposed on the carrier 910. In the manufacturing process, a plurality of through silicon vias 715 can be formed in the substrate layer 712' and a part of the device layer 711 of the memory chip 710. The through silicon via 715 includes a metal conductor material. It should be understood that the through silicon vias may be a vertical interconnection structure filled with metal. The material of the filler metal includes but is not limited to copper (Cu) or tungsten (W). In some embodiments, a diffusion barrier layer (not shown) is further provided between the through silicon vias as well as the substrate layer and the device layer to prevent the diffusion of metal materials. Therefore, referring to FIG. 9A and FIG. 9B, the surface S3' of the substrate layer 712' can be ground, polished, and/or etched, so that the height of the substrate layer 712 is reduced, and the metal conductor material in the through silicon via 715 can be exposed from the surface S3 after the surface S3 is ground and polished. The through silicon via 715 penetrates the substrate layer 712 and the part of the device layer 711 to connect to the circuit wiring in the device layer 711. In some embodiments, the through silicon via 715 may be connected to the circuit wiring in the device layer 711 and multiple bonding elements respectively through metal traces (not shown) inside the device layer 711. Referring to FIG. 9C, during the manufacturing process, a redistribution layer 760 may be formed on the surface S3 of the memory chip 710. The redistribution layer 760 is connected to the through silicon via 750. It can be understood that the redistribution layer 760 may be one layer or multiple layers, and the disclosure is not limited thereto. Next, a plurality of bumps 770 are formed on the redistribution layer 760. In some embodiments of the disclosure, during the manufacturing process, another memory chip can be manufactured, and the redistribution layer 760 is further connected to another plurality of through silicon vias of the other memory chip. In other embodiments of the disclosure, in the manufacturing process, input/output chips can also be manufactured, an input/output circuit can be formed on the input/output chip, and the redistribution layer 760 can be connected to the input/output circuit of the input/output chip. Referring to FIG. 9D, in the manufacturing process, the carrier 910 can be removed and turned upside down, and then dicing is performed. For example, the memory wafer can be diced into multiple memory chips as needed, and each memory chip is provided with a certain number of logic cores. Referring to FIG. 9E, in the manufacturing process, the redistribution layer 760 may be bonded to the packaging substrate 930 through a plurality of bumps 770.

In summary, the chipset and manufacturing method thereof of the disclosure can effectively save the space for circuit wiring on the logic core, and by bonding multiple logic cores and memory chips in a die-to-die manner, it is possible to effectively save the space for arranging bumps, and the number of logic cores can be increased effectively. In addition, the hybrid bonding method for bonding the multiple logic cores and memory chips can also reduce the electrostatic discharge (ESD) effect between the multiple logic cores and the memory chips.

Finally, it should be noted that the above embodiments are only used to illustrate the technical solutions of the present disclosure, but not to limit them. Although the present disclosure has been described in detail with reference to the foregoing embodiments, those of ordinary skill in the art should understand that: The technical solutions described in the foregoing embodiments can still be modified, or some or all of the technical features can be equivalently replaced. These modifications or replacements do not make the essence of the corresponding technical solutions deviate from the scope of the technical solutions in the embodiments of the present disclosure.

What is claimed is:

1. A chipset, comprising:
   a plurality of logic cores respectively having a first device layer and a first substrate layer, wherein the plurality of logic cores respectively comprise:
   a plurality of first bonding elements provided in the first device layer, wherein a plurality of first bonding surfaces of the plurality of first bonding elements are of the same height as a first surface of the first device layer; and
   a first input/output circuit disposed in the first device layer;
   a memory chip having a second device layer and a second substrate layer, wherein the memory chip comprises:
   a plurality of second bonding elements provided in the second device layer, wherein a plurality of second bonding surfaces of the plurality of second bonding elements are of the same height as a second surface of the second device layer; and
   a plurality of second input/output circuits provided in the second device layer, and respectively connected to the first input/output circuit of the plurality of logic cores; and
   a redistribution layer disposed on a third surface of the memory chip;
   another memory chip; and
   a third input/output circuit disposed in the second device layer,
   wherein the first surface faces the second surface, the third surface is opposite to the second surface, and the plurality of first bonding surfaces of the plurality of first bonding elements of the plurality of logic cores are respectively directly bonded to the plurality of second bonding surfaces of the plurality of second bonding elements of the memory chip in a pad-to-pad manner, wherein the second device layer of the memory chip comprises a circuit wiring, and the plurality of second input/output circuits are connected to the circuit wiring, wherein the plurality of logic cores communicate with each other through the plurality of the first input/output circuits, the plurality of second input/output circuits and the circuit wiring, wherein the memory chip and the another memory chip are disposed on the same side of the redistribution layer, wherein the third input/output circuit is connected to the circuit wiring, and the third input/output circuit is further connected to a wiring distributed around the plurality of logic cores, and configured to provide a power signal or a data signal to the plurality of logic cores through the wiring.

2. The chipset according to claim 1, wherein the plurality of logic cores and the memory chip are bonded together through the plurality of first bonding elements and the plurality of second bonding elements in a hybrid bonding manner, and the plurality of first bonding elements and the plurality of second bonding elements respectively comprise:
a bonding pad having a bonding surface;
a pillar, wherein one end of the pillar is connected to the bonding pad; and
a metal pad connected to the other end of the pillar,
wherein at least a part of the plurality of first bonding elements transmits power signals and/or data signals through the plurality of corresponding second bonding elements.

3. The chipset according to claim 1, wherein the memory chip further comprises a plurality of through silicon vias penetrating through the second substrate layer and extending into at least a part of the second device layer, and the plurality of through silicon vias are respectively connected to the circuit wiring and the plurality of second bonding elements.

4. The chipset according to claim 3, wherein the redistribution layer is connected to the plurality of through silicon vias.

5. The chipset according to claim 4, wherein the redistribution layer is further connected to another plurality of through silicon vias of the another memory chip.

6. The chipset according to claim 4, further comprising:
a first input/output chip,
wherein the redistribution layer is further connected to the first input/output chip.

7. The chipset according to claim 4, further comprising:
a packaging substrate, wherein the redistribution layer is bonded to the packaging substrate through a plurality of bumps.

8. The chipset according to claim 1, wherein the memory chip further comprises:
a fourth input/output circuit disposed in the second device layer, wherein the chipset further comprises:
a second input/output chip comprising a fifth input/output circuit,
wherein the fourth input/output circuit of the memory chip is connected to the fifth input/output circuit of the second input/output chip, and the second input/output chip is directly bonded to the memory chip in the pad-to-pad manner.

9. A chipset t manufacturing method, comprising:
manufacturing a logic core wafer, wherein the logic core wafer comprises a plurality of logic cores, and the logic core wafer has a first device layer and a first substrate layer;

forming a plurality of first bonding elements and a first input/output circuit in the first device layer of each of the plurality of logic cores, wherein a plurality of first bonding surfaces of the plurality of first bonding elements are of the same height as a first surface of the first device layer;

dicing the logic core wafer into a plurality of dies with the plurality of logic cores;

manufacturing a memory chip, wherein the memory chip has a second device layer and a second substrate layer;

forming a plurality of second bonding elements and a plurality of second input/output circuits respectively connected to the first input/output circuit of the plurality of logic cores in the second device layer, wherein a plurality of second bonding surfaces of the plurality of second bonding elements are of the same height as a second surface of the second device layer, and the first surface faces the second surface; and directly bonding the plurality of first bonding elements of the plurality of dies to the plurality of second bonding elements of the memory chip respectively in a pad-to-pad manner;

forming a redistribution layer on a third surface of the memory chip, wherein the third surface is opposite to the second surface; and manufacturing another memory chip, wherein the memory chip and the another memory chip are disposed on the same side of the redistribution layer; and forming a third input/output circuit in the second device layer, wherein the step of manufacturing the memory chip comprises:

forming a circuit wiring in the second device layer of the memory chip, wherein the plurality of second input/output circuits are connected to the circuit wiring, wherein the third input/output circuit is connected to the circuit wiring, and the third input/output circuit is further connected to a wiring distributed around the plurality of logic cores, and configured to provide a power signal or a data signal to the plurality of logic cores through the wiring.

10. The chipset manufacturing method according to claim 9, wherein the plurality of logic cores of the plurality of dies and the memory chip are bonded together through the plurality of first bonding elements and the plurality of second bonding elements in a hybrid bonding manner, and the plurality of first bonding elements and the plurality of second bonding elements respectively comprise:
a bonding pad having a bonding surface;
a pillar, wherein one end of the pillar is connected to the bonding pad; and
a metal pad connected to the other end of the pillar.

11. The chipset manufacturing method according to claim 9, wherein the step of manufacturing the memory chip comprises:
forming a plurality of through silicon vias penetrating the second substrate layer and extending into at least a part of the second device layer, wherein the plurality of through silicon vias are respectively connected to the circuit wiring and the plurality of second bonding elements.

12. The chipset manufacturing method according to claim 11, wherein the redistribution layer is connected to the plurality of through silicon vias.

13. The chipset manufacturing method according to claim 12, wherein the redistribution layer is further connected to another plurality of through silicon vias of the another memory chip.

14. The chipset manufacturing method according to claim 12, further comprising:
   forming a first input/output chip; and
   connecting the redistribution layer to the first input/output chip.

15. The chipset manufacturing method according to claim 12, further comprising:
   forming a plurality of bumps on the redistribution layer;
   bonding the redistribution layer to a packaging substrate through the plurality of bumps.

16. The chipset manufacturing method according to claim 9, further comprising:
   forming a fourth input/output circuit in the second device layer of the memory chip;
   forming a fifth input/output circuit on a second input/output chip; and
   directly bonding the second input/output chip to the memory chip in the pad-to-pad manner, so that the fourth input/output circuit of the memory chip is connected to the fifth input/output circuit of the second input/output chip.

* * * * *